(12) United States Patent  (10) Patent No.: US 8,705,766 B2
Takanezawa  (45) Date of Patent: Apr. 22, 2014

(54) INFORMATION PROCESSING APPARATUS, INFORMATION PROCESSING SYSTEM, AND METHOD OF CONTROLLING INFORMATION PROCESSING APPARATUS

(75) Inventor: Tetsuhiro Takanezawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 923 days.

(21) Appl. No.: 12/397,465

(22) Filed: Mar. 4, 2009

(65) Prior Publication Data

US 2009/0226008 A1  Sep. 10, 2009

(30) Foreign Application Priority Data

Mar. 4, 2008 (JP) .................................. 2008-054069

(51) Int. Cl.
*H03G 3/00* (2006.01)
(52) U.S. Cl.
USPC ............................. 381/105; 381/107; 381/97
(58) Field of Classification Search
USPC .......................................... 381/107, 71.1, 97
See application file for complete search history.

(56) References Cited

U.S. PATENT DOCUMENTS

| 4,184,048 | A | * | 1/1980 | Alcaide .................... 379/388.02 |
| 6,052,665 | A | * | 4/2000 | Momii et al. ................. 704/270 |
| 7,194,084 | B2 | * | 3/2007 | Shaffer et al. ............ 379/420.01 |

FOREIGN PATENT DOCUMENTS

| JP | 2000-236330 A | 8/2000 | .............. H04L 12/18 |
| JP | 2002-368866 A | 12/2002 | .............. H04M 3/56 |
| JP | 2006-340376 A | 12/2006 | .............. H04L 12/18 |

* cited by examiner

*Primary Examiner* — David Vu
*Assistant Examiner* — Jonathan Han
(74) *Attorney, Agent, or Firm* — Fitzpatrick, Cella, Harper & Scinto

(57) ABSTRACT

This invention allows changing the volume of a received specific input audio without influencing other audio output devices in a terminal apparatus to which a plurality of audio output devices is connected. This invention provides a terminal apparatus, which is connected to a plurality of audio output devices, and controls to output a plurality of audio data to any of the audio output devices, including a determination unit which determines the audio output devices used to output the plurality of audio data based on information indicating the relationship among audio input devices used to generate the plurality of audio data, and information indicating the relationship among the audio output devices, a mixing unit which mixes the plurality of audio data when it is determined that the plurality of audio data are output to one audio output device.

20 Claims, 17 Drawing Sheets

| AUDIO DATA | AUDIO OUTPUT DEVICE |
|---|---|
| Audio1 | SP1, SP2, SP3 |
| Audio2, Audio3 | SP4, SP5, SP6 |
| Audio4 | SP7 |
| Audio5 | SP8 |

F I G. 6

| AUDIO OUTPUT DEVICE | NUMBER OF TERMINAL APPARATUSES ON TRANSMITTING SIDE | | |
|---|---|---|---|
| | 1 | 2 | 3 |
| SP1 | I | I | I |
| SP2 | I | I | I |
| SP3 | I | I | I |
| SP4 | I | I | II |
| SP5 | I | II | II |
| SP6 | I | II | II |
| SP7 | I | II | III |
| SP8 | I | II | III |

FIG. 9A

| AUDIO DATA | PRIORITY LEVEL |
|---|---|
| Audio1 | 1 |
| Audio2 | 1 |
| Audio3 | 3 |
| Audio4 | 4 |
| Audio5 | 5 |

FIG. 9B

| AUDIO OUTPUT DEVICE | PRIORITY LEVEL |
|---|---|
| SP1 | 1 |
| SP2 | 1 |
| SP3 | 2 |
| SP4 | 4 |
| SP5 | 4 |
| SP6 | 4 |
| SP7 | 4 |
| SP8 | 4 |

FIG. 11
| AUDIO DATA | AUDIO OUTPUT DEVICE |
|---|---|
| Audio1, Audio2 | SP1, SP2, SP3 |
| Audio3, Audio4 | SP4, SP5, SP6, SP7, SP8 |
FIG. 12A
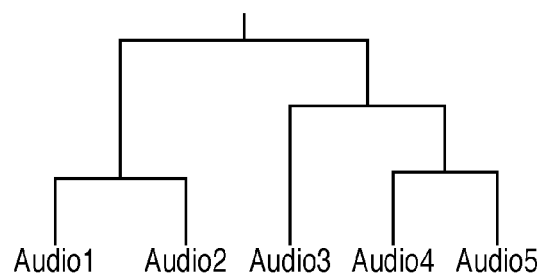
FIG. 12B
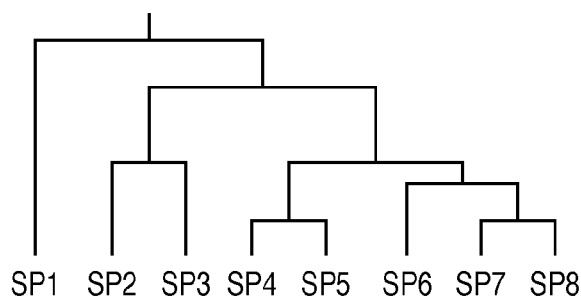

| AUDIO DATA | AUDIO OUTPUT DEVICE |
|---|---|
| Audio1, Audio2 | SP1 |
| Audio3 | SP2, SP3 |
| Audio4 | SP4, SP5 |
| Audio5 | SP6, SP7, SP8 |

| AUDIO DATA | AUDIO OUTPUT DEVICE |
|---|---|
| 105 Audio1 | SP1 |
| 104 Audio1 | SP2 |
| 104 Audio2 | SP3 |
| 104 Audio3 | SP4, SP5 |
| 104 Audio4 | SP6 |
| 104 Audio5 | SP7, SP8 |

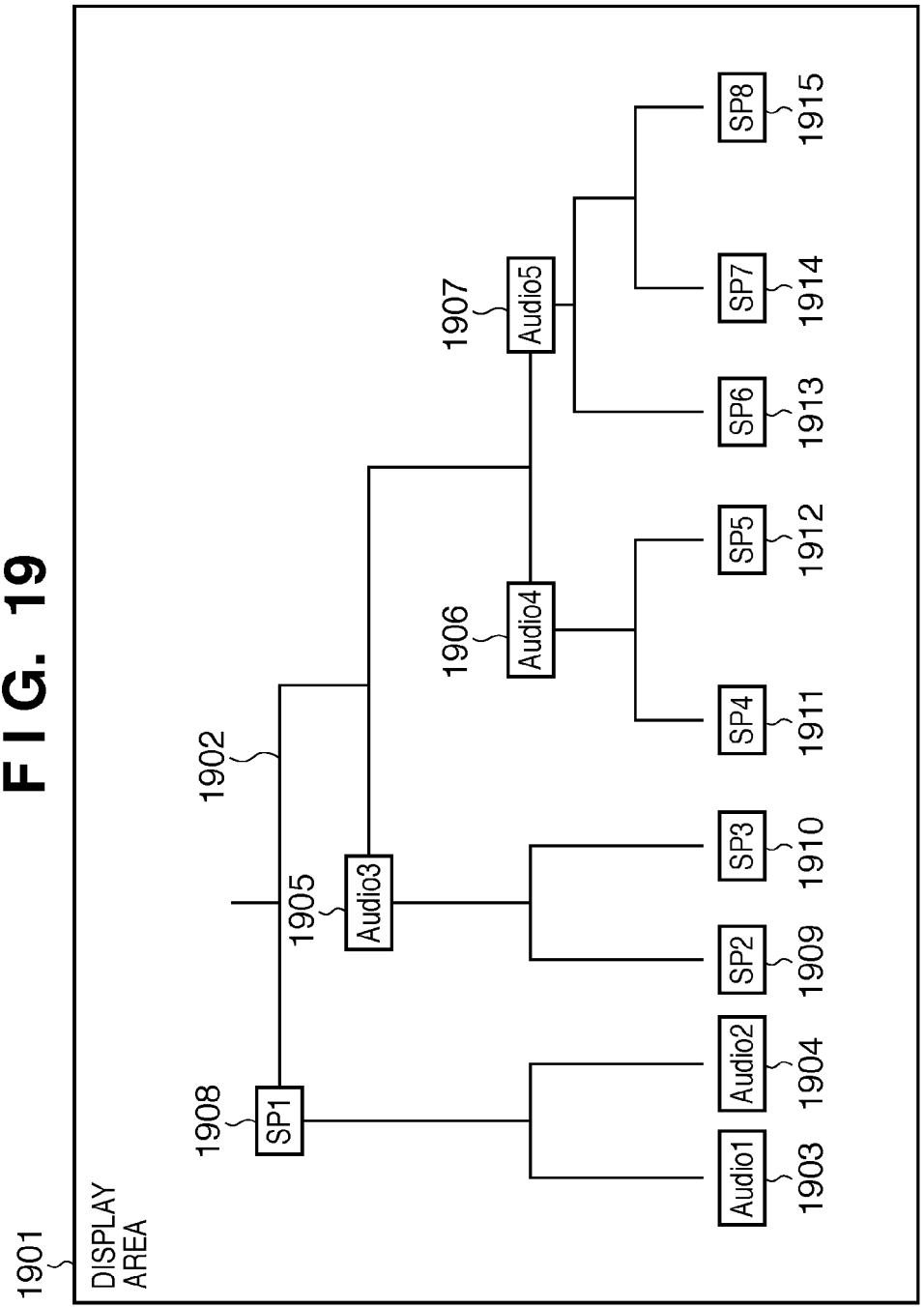

INFORMATION PROCESSING APPARATUS, INFORMATION PROCESSING SYSTEM, AND METHOD OF CONTROLLING INFORMATION PROCESSING APPARATUS

BACKGROUND OF THE INVENTION

1. Field of the Invention

The present invention relates to a control technique for controlling the output destinations of audio data received via a network in an information processing apparatus to which a plurality of audio output devices are connected.

2. Description of the Related Art

Conventionally, a video conference system which connects a plurality of sites via communications using an ISDN line is known. In this system, when a plurality of terminal apparatuses are used per site, it is a common practice to mix input audios received by the respective terminal apparatuses via an MCU (Multi Point Control Unit) and to deliver the mixed audio data.

When a plurality of audio input devices are connected to one terminal apparatus, it is common practice to mix input audios in that terminal apparatus and to deliver the mixed audio data (for example, see Japanese Patent Laid-Open No. 2002-368866).

However, the video conference system implemented by Japanese Patent Laid-Open No. 2002-368866 suffers the following problems.

First, when the volume of an input audio received by a specific terminal apparatus on the input side is to be changed on the output side, a desired change cannot be made.

For example, when a user on the output side feels that the volume of an input audio from a specific terminal apparatus on the input side is small, even when the volume of an audio output of a terminal apparatus used by the user on the output side is changed, the volume of the input audio from the specific terminal apparatus on the input side alone cannot be changed. That is, in this case, the volumes of input audios from other terminal apparatuses on the input side are similarly unwantedly changed.

Second, assuming the volume of an input audio received by a specific terminal apparatus is changed and delivered on the input side, when only a specific user on the output side wants to receive the input audio with the changed volume, such reception cannot be realized.

For example, when a terminal apparatus (or MCU) which delivers a mixed audio changes the volume of a specific input audio, the volume of not only the input audio delivered to the specific user but also that delivered to other users is unwantedly changed.

SUMMARY OF THE INVENTION

The present invention has been made in consideration of the aforementioned problems.

An information processing apparatus according to the present invention comprises the following arrangement. That is, an information processing apparatus which is connected to a plurality of audio output devices, and controls to output a plurality of audio data received via a network to any of the audio output devices, comprising: a determination unit configured to determine the audio output devices used to output the plurality of audio data based on information indicating a relationship among audio input devices used to generate the plurality of audio data, and information indicating a relationship among the audio output devices; a mixing processing unit configured to mix the plurality of audio data when it is determined as a result of determination by the determination unit that the plurality of audio data are output to one audio output device; and a distribution unit configured to distribute one audio data when it is determined as a result of determination by the determination unit that the one audio data is output to the plurality of audio output devices.

According to the present invention, an information processing apparatus at each site which is connected to a plurality of audio output devices individually mixes the volumes of specific input audios of a plurality of received input audios. For this reason, the volumes of the specific input audios can be changed without influencing other audio output devices.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a view showing an example of audio output relationship information 208;

FIG. 9A is a view showing an example of audio input relationship information 207;

FIG. 9B is a view showing an example of audio output relationship information 208;

FIG. 11 is a view showing an example of combinations of audio data and audio output devices, the assignments of which are calculated based on FIGS. 9A and 9B;

FIG. 12A is a view showing an example of audio input relationship information 207;

FIG. 12B is a view showing an example of audio output relationship information 208;

FIG. 19 is a view showing a display example of the calculation result.

DESCRIPTION OF THE EMBODIMENTS

Preferred embodiments of the present invention will now be described in detail in accordance with the accompanying drawings.

[First Embodiment]

<1. Overall Arrangement of Video Conference System>

Figure 1:
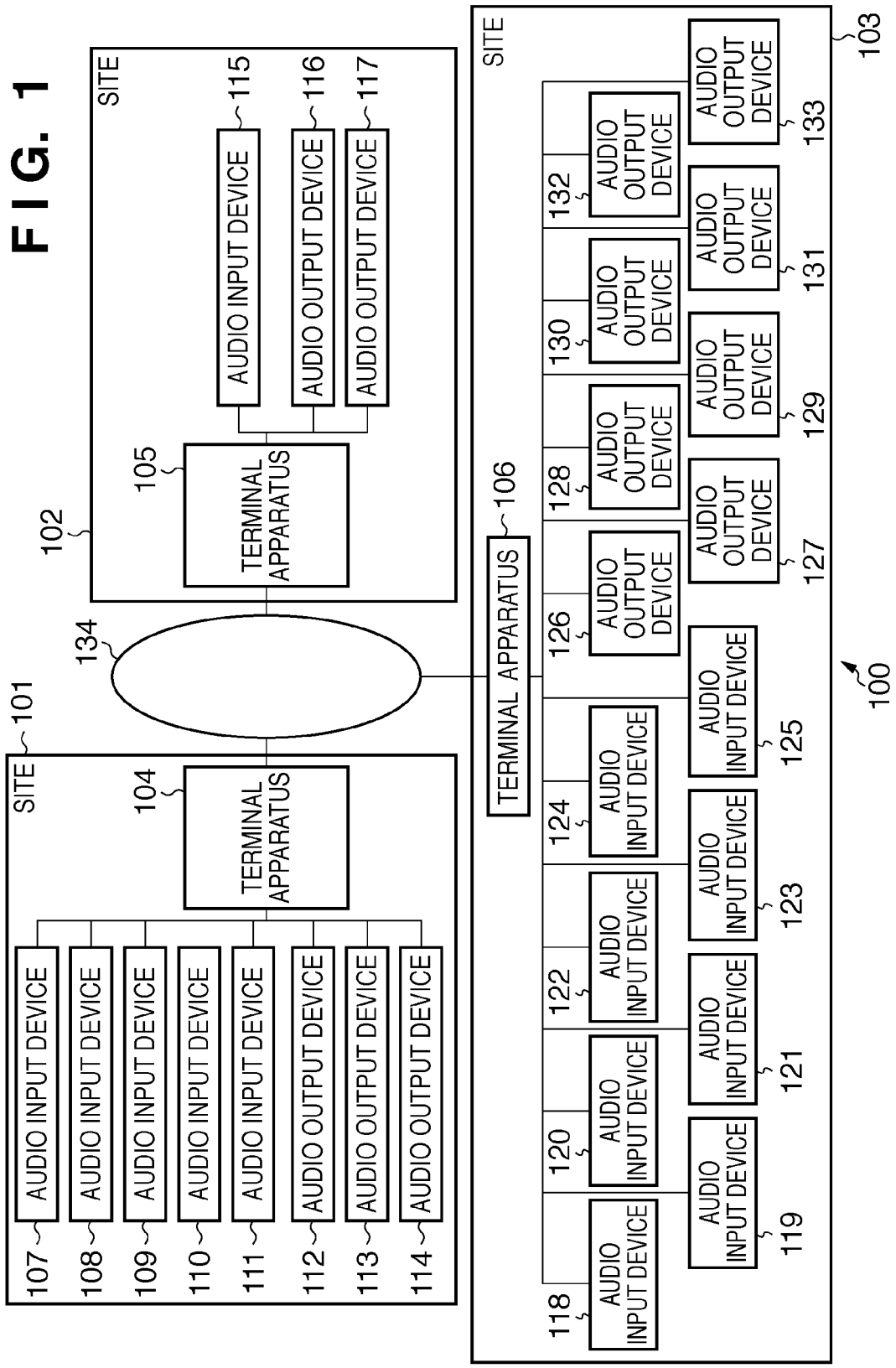
FIG. 1 is a block diagram showing the overall arrangement of a video conference system built by using an information processing system in which information processing apparatuses (terminal apparatuses 104 to 106) according to the first embodiment of the present invention connect three sites 101 to 103 via a network 134.

FIG. 1 is a block diagram showing the overall arrangement of a video conference system built using an information processing system in which information processing apparatuses (terminal apparatuses 104 to 106) according to the first embodiment of the present invention connect three sites 101 to 103 via a network 134. Note that the example shown in FIG. 1 shows only the input and output functions of audio data (for example, audio track or audio stream) of the video conference system for the sake of simplicity.

To the terminal apparatuses arranged at the sites 101 to 103, audio input devices such as microphones and audio output devices such as loudspeakers are respectively connected.

Five audio input devices 107 to 111 and three audio output devices 112 to 114 are available at the site 101. One audio input device 115 and two audio output devices 116 and 117 are available at the site 102. Furthermore, eight audio input devices 118 to 125 and eight audio output devices 126 to 133 are available at the site 103.

Note that the audio input devices and audio output devices may be microphones and loudspeakers which are directly connected to the terminal apparatuses or may be those which are incorporated in or connected to devices such as televisions, personal computers, and cameras, which can be connected to the terminal apparatuses via a network or the like.

<2. Arrangement of Terminal Apparatus>

Figure 2:
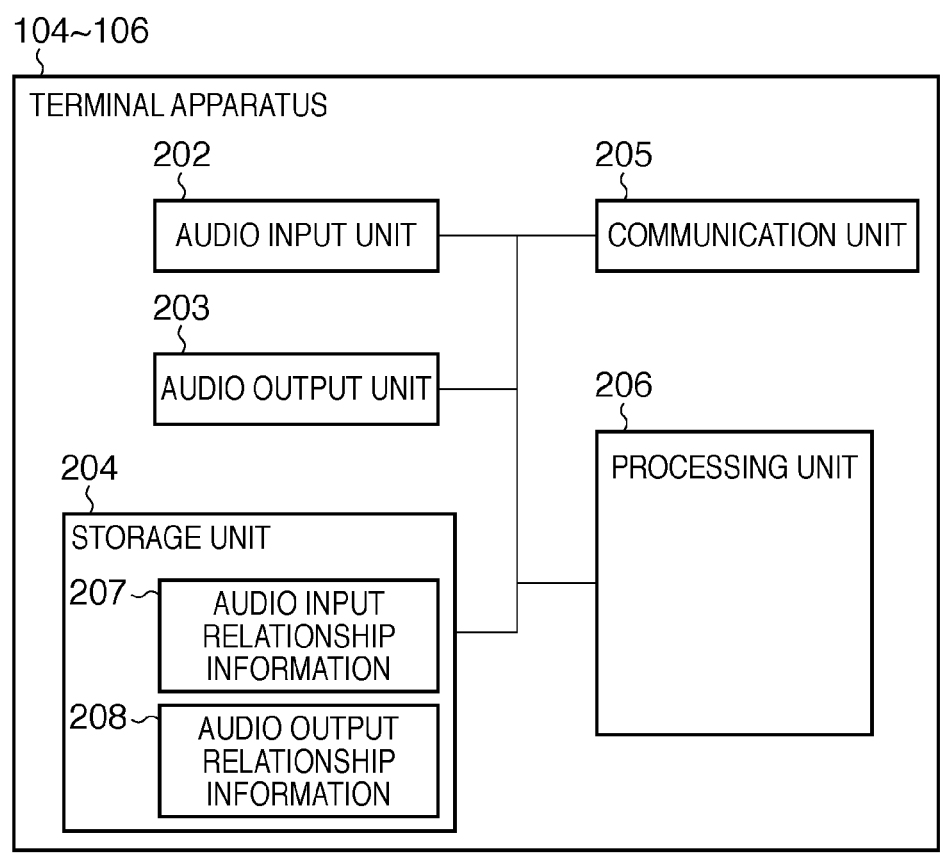
FIG. 2 is a block diagram showing the functional arrangement of the terminal apparatuses 104 to 106.

FIG. 2 is a block diagram showing the functional arrangement of the terminal apparatuses 104 to 106. Referring to FIG. 2, reference numeral 205 denotes a communication unit which exchanges audio data and the like via the network 134. Reference numeral 202 denotes an audio input unit which generates audio data based on an audio input from an audio input device such as a microphone. When a plurality of audio input devices are connected, a plurality of audio input units 202 are arranged.

Reference numeral 203 denotes an audio output unit which plays back audio data using an audio output device such as a loudspeaker. When a plurality of audio output devices are connected, a plurality of audio output units 203 are arranged.

As described above, as the audio input devices and audio output devices, microphones and loudspeakers incorporated in or connected to devices such as personal computers, televisions, and cameras, which are connected via the network may also be used. In this case, the functions of the audio input unit 202 and audio output unit 203 are included in a processing unit 206 to be described later and the aforementioned communication unit 205.

Reference numeral 204 denotes a storage unit such as a Random Access Memory (RAM), hard disk, optical disk, or memory card, which stores data. The storage unit 204 stores audio input relationship information 207 which indicates the relationship among a plurality of audio input devices connected via the audio input units 202, and audio output relationship information 208 which indicates the relationship among a plurality of audio output devices connected via the audio output units 203.

Note that the audio input relationship information 207 and audio output relationship information 208 may be generated when the user inputs these pieces of information. Alternatively, upon detection of connections of the audio input devices and audio output devices, the terminal apparatus itself may acquire pieces of specific information such as models, installation positions, and roles of the respective devices, and may generate audio input relationship information 207 and audio output relationship information 208 using these pieces of acquired information.

Reference numeral 206 denotes a processing unit such as a Central Processing unit (CPU) which executes control and arithmetic processing of the terminal apparatus.

<3. Functional Arrangement of Processing Unit of Terminal Apparatus>

Figures 3, 4:
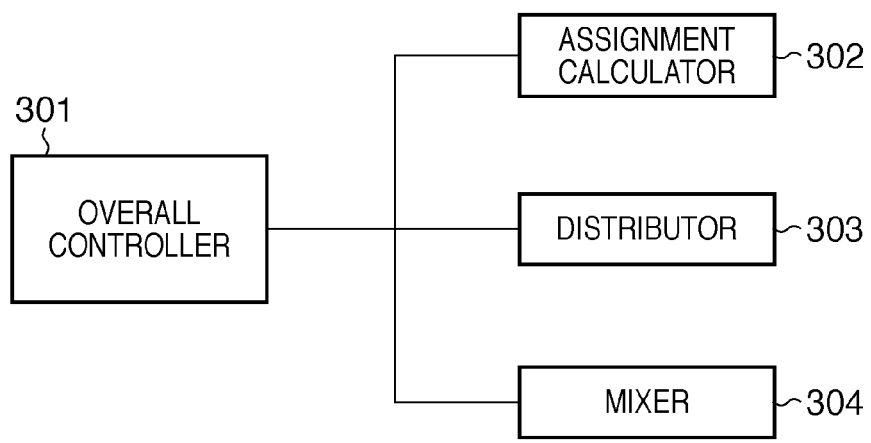
FIG. 3 is a block diagram showing an example of the functional arrangement that shows the functions implemented by a processing unit 206.
FIG. 4 is a view showing an example of the calculation result of an assignment calculator 302.

FIG. 3 is a block diagram showing an example of the functional arrangement that shows the functions implemented by the processing unit 206 shown in FIG. 2. In this embodiment, assume that the functions of respective units shown in FIG. 3 are implemented when programs stored in the storage unit 204 shown in FIG. 2 are loaded and executed by the processing unit 206 shown in FIG. 2.

Referring to FIG. 3, reference numeral 301 denotes an overall controller which controls the overall terminal apparatus. The overall controller detects connections/disconnections of the audio input devices such as microphones and the audio output devices such as loudspeakers, which can be used, and updates the audio input relationship information 207 and audio output relationship information 208 stored in the storage unit 204.

Reference numeral 302 denotes an assignment calculator which calculates assignments between audio data and the audio output devices based on the audio input relationship information 207 and audio output relationship information 208. Reference numeral 303 denotes a distributor which distributes audio data to be played back by the plurality of audio output devices. Reference numeral 304 denotes a mixer which mixes a plurality of audio data.

FIG. 4 is a view showing an example of the calculation result in the assignment calculator 302. FIG. 4 shows an example in which five audio data are received, and are assigned to eight audio output devices. Each row indicates a combination of audio data and an audio output device which plays back that audio data.

For example, as shown in FIG. 4, audio data generated by Audio2 and Audio3 (audio input devices 108 and 109) are mixed, and mixed audio data is distributed to and is played back by the audio output devices 129 to 131 corresponding to SP4, SP5, and SP6.

<4. Sequence of Playback Processing in Terminal Apparatus>

Figure 5:
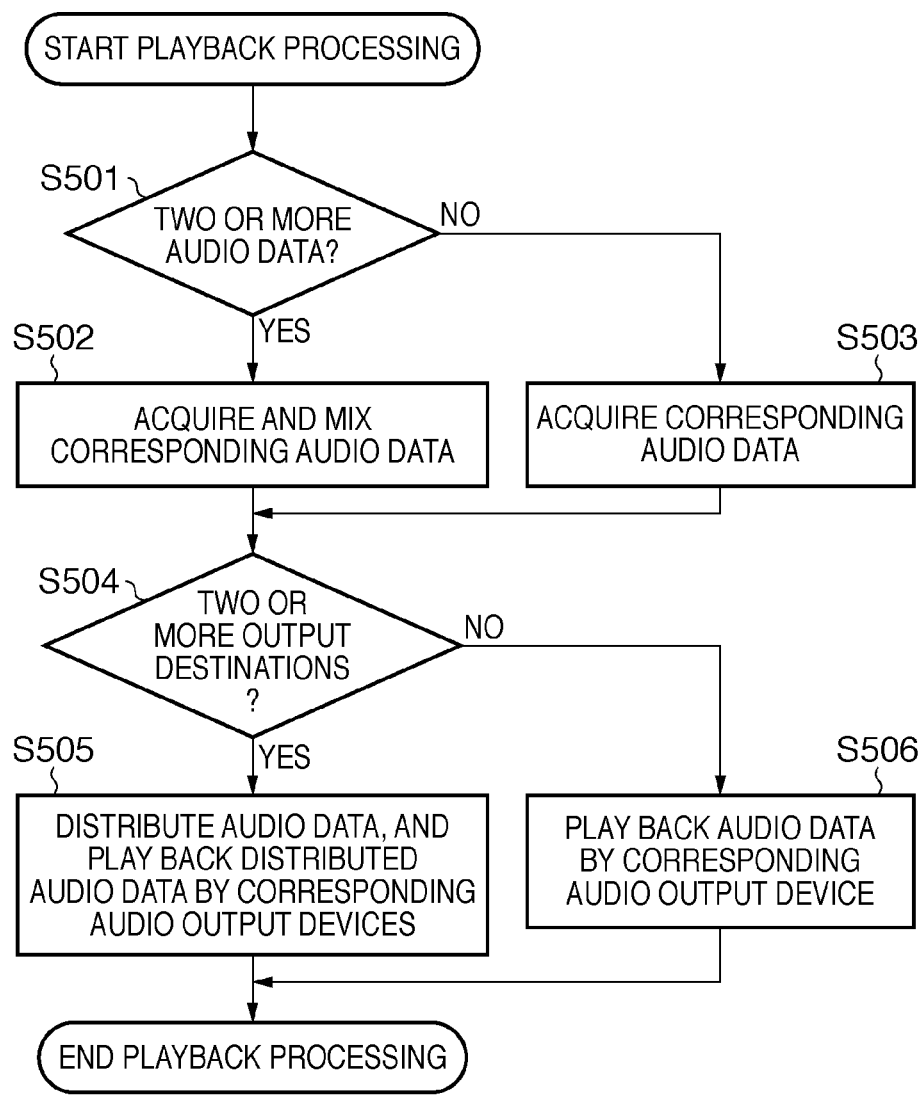
FIG. 5 is a flowchart showing the sequence of playback processing executed by the processing unit 206 of each of the terminal apparatuses 104 to 106.

The sequence of playback processing of each of the terminal apparatuses 104 to 106, which is executed based on the calculation result of the assignment calculator 302, will be described below. FIG. 5 is a flowchart showing the sequence of the playback processing executed by the processing unit 206 of each of the terminal apparatuses 104 to 106.

The overall controller 301 checks in step S501 if combinations as the calculation result of the assignment calculator 302 include one which includes two or more audio data. If it is determined in step S501 that a combination including two or more audio data is found, the process advances to step S502. In step S502, corresponding audio data are acquired from the received audio data, and the mixer 304 executes mixing processing of the acquired audio data.

On the other hand, if it is determined in step S501 that only one audio data is included in each combination, the process advances to step S503, and corresponding audio data is acquired from the received audio data.

The overall controller 301 checks in step S504 if combinations as the calculation result of the assignment calculator 302 include one which includes two or more audio output devices.

If it is determined in step S504 that a combination including two or more audio output devices is found, the process advances to step S505. In step S505, the distributor 303 executes processing for distributing the corresponding audio data into data as many as the corresponding number of audio output devices, and the distributed audio data are played back by the corresponding audio output devices via the audio output units 203.

On the other hand, if it is determined in step S504 that only one audio output device is included in each combination, the process advances to step S506, and audio data is played back by the corresponding audio output device via the audio output unit 203.

<5. Operation Example in Video Conference System>

An operation example in the video conference system shown in FIG. 1 will be described below. More specifically, operations until audios input at the site 101 are delivered to the sites 102 and 103 and are played back will be described.

The terminal apparatus 104 at the site 101 acquires audio data input from the five audio input devices 107 to 111 connected via the audio input units 202. The terminal apparatus 104 delivers the five audio data to the terminal apparatus 105 at the site 102 and the terminal apparatus 106 at the site 103 via the communication unit 205 after they are multiplexed or using independent streams.

At the same time, the terminal apparatus 104 at the site 101 delivers the audio input relationship information 207 indicating the relationship among the five audio input devices to the terminal apparatus 105 at the site 102 and the terminal apparatus 106 at the site 103 via the communication unit 205.

The overall controller 301 of the terminal apparatus 105 at the site 102 activates the assignment calculator 302. The assignment calculator 302 calculates assignments of audio data to be played back by the two audio output devices connected to the audio output units 203 based on the received audio input relationship information and the audio output relationship information 208 stored in the storage unit 204 of the terminal apparatus 105.

As a result of the calculation, assume that the five audio data are assigned so that three out of the five audio data are played back by the audio output device 116, and the remaining two audio data are played back by the audio output device 117. In this case, the overall controller 301 of the terminal apparatus 105 activates the mixer 304. The mixer 304 executes mixing processing of the three audio data corresponding to the calculation result from the received five audio data, and the mixed audio data is played back by the audio output device 116 via the audio output unit 203. Also, the mixer 304 executes mixing processing of the remaining two audio data corresponding to the calculation result, and the mixed audio data is played back by the audio output device 117 via the audio output unit 203.

Likewise, the overall controller 301 of the terminal apparatus 106 at the site 103 activates the assignment calculator 302. The assignment calculator 302 calculates assignments of audio data to be played back by the eight audio output devices connected to the audio output units 203 based on the received audio input relationship information and the audio output relationship information 208 stored in the storage unit 204 of the terminal apparatus 106.

As a result of the calculation, assume that the five audio data are assigned so that one of the five audio data played back by the four audio output devices 126 to 129, and the remaining four audio data are respectively played back by the four audio output devices 130 to 133. In this case, the overall controller 301 of the terminal apparatus 106 activates the distributor 303. The distributor 303 distributes the corresponding one audio data into four data based on the calculation result, and these distributed audio data are played back by the audio output devices 126 to 129 via the audio output units 203. Also, the remaining four audio data are respectively played back by the audio output devices 130 to 133 corresponding to the calculation result via the audio output units 203.

As another example, as a result of the calculation, assume that five audio data are assigned so that all these audio data are mixed and the mixed audio data is played back by the eight audio output devices. In this case, the overall controller 301 of the terminal apparatus 106 activates the mixer 304 and distributor 303. The mixer 304 executes mixing processing of the five audio data. The distributor 303 executes distribution processing of the mixed audio data to be played back by the eight audio output devices 126 to 133. Then, the distributed audio data are played back by the audio output devices 126 to 133 via the audio output units 203.

As can be seen from the above description, according to this embodiment, for example, by changing the playback volume of SP1 (audio output device 126), the playback volume of only one audio data (that generated by Audio1) of the audio input devices on the transmitting side can be changed. That is, the playback volumes of the audio data of the individual audio input devices on the transmitting side can be changed on the receiving side.

[Second Embodiment]

The first embodiment has explained the case in which the audio input relationship information and audio output relationship information are determined in advance. However, the present invention is not limited to such specific embodiment. For example, the transmitting side may sequentially change the audio input relationship information.

More specifically, the storage unit 204 of the terminal apparatus on the transmitting side is configured to store a plurality of pieces of audio input relationship information 207, and to selectively transmit one audio input relationship information to other terminal apparatuses. At this time, the audio input relationship information 207 is allowed to be switched even during transmission of audio data.

In the terminal apparatus on the receiving side, the assignment calculator 302 calculates assignments of audio data to the audio output devices based on the received audio input relationship information 207 and the audio output relationship information 208 stored in the storage unit 204 of that terminal apparatus.

Then, upon detection of a change in audio input relationship information 207 transmitted from the terminal apparatus on the transmitting side, the assignment calculator 302 is activated again. The assignment calculator 302 calculates again the assignments of audio data to the audio output devices based on the changed audio input relationship information 207 and the stored audio output relationship information 208 of the terminal apparatus on the receiving side, and audio data are played back based on the calculation result.

In this manner, a plurality of pieces of audio input relationship information are stored in the terminal apparatus on the transmitting side, and one of these plurality of pieces of audio input relationship information is selectively transmitted, thus sequentially changing the assignments of audio data to be played back by the terminal apparatus on the receiving side to the audio output devices.

[Third Embodiment]

The second embodiment adopts the arrangement in which the transmitting side selectively transmits audio input relationship information. However, the present invention is not limited to this, and an arrangement in which audio output relationship information is switched on the receiving side may be adopted.

More specifically, the storage unit 204 of the terminal apparatus on the receiving side is configured to store a plurality of pieces of audio output relationship information 208, and the assignment calculator 302 selectively uses one of these pieces of audio output relationship information 208 to execute calculation processing.

Then, the overall controller 301 instructs the assignment calculator 302 to execute calculation processing while switching the audio output relationship information 208 to be used during playback of the received audio data. Upon reception of the switching instruction of the overall controller 301, the assignment calculator 302 re-calculates the assignments of audio data to the audio output devices, and the mixer or distributor executes mixing processing or distribution processing of the audio data based on the calculation result, thus playing back the audio data.

In this way, since the audio output relationship information 208 to be used by the terminal apparatus on the receiving side is switched, the assignments of audio data to the audio output devices can be sequentially changed without any influence on other terminal apparatuses on the receiving side.

[Fourth Embodiment]

The first embodiment has not described details of the calculation processing for calculating the assignments of audio data to the audio output devices. However, for example, the calculation processing may be executed using the following audio output relationship information.

<1. Audio Output Relationship Information>

FIG. 6 is a view showing an example of the audio output relationship information 208. As shown in FIG. 6, the audio output relationship information 208 according to this embodiment includes information indicating grouping of a plurality of audio output devices on the receiving side in accordance with the number of terminal apparatuses on the transmitting side.

When the number of terminal apparatuses on the transmitting side is one, all eight audio output devices belong to the same group. When the number of terminal apparatuses on the transmitting side is two, SP1 to SP4 (audio output devices 126 to 129) belong to the first group, and SP5 to SP8 (audio output devices 130 to 133) belong to the second group.

Furthermore, when the number of terminal apparatuses on the transmitting side is three, SP1 to SP3 (audio output devices 126 to 128) belong to the first group. SP4 to SP6 (audio output devices 129 to 131) belong to the second group. Furthermore, SP7 and SP8 (audio output devices 132 and 133) belong to the third group.

Assume that the terminal apparatuses 104 and 105 are on the transmitting side, and the terminal apparatus 106 is on the receiving side in FIG. 1. In this case, since the number of terminal apparatuses on the transmitting side is two, the audio output devices are grouped into two groups, that is, a group including SP1 to SP4, and that including SP5 to SP8.

Note that when the terminal apparatus on the receiving side has the audio output relationship information shown in FIG. 6, audio input relationship information to be transmitted by each terminal apparatus on the transmitting side indicates via which terminal apparatus each individual audio data is delivered. The assignment calculation processing in the assignment calculator 302 in this case is as follows.

<2. Sequence of Assignment Calculation Processing in Assignment Calculator>

Figure 7:
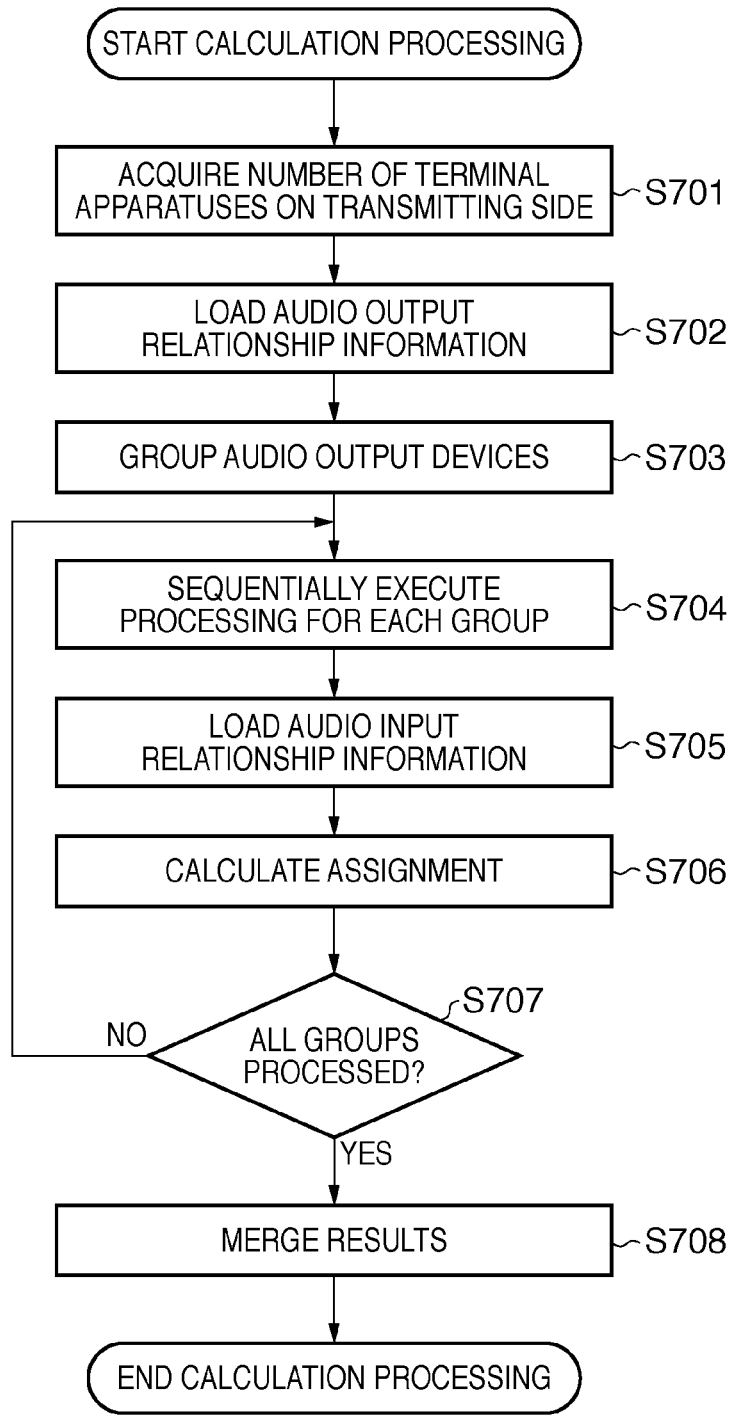
FIG. 7 is a flowchart showing the sequence of assignment calculation processing executed by the assignment calculator 302.

FIG. 7 is a flowchart showing the sequence of the assignment calculation processing executed by the assignment calculator 302 based on the aforementioned audio input relationship information and audio output relationship information. The processing contents will be described below with reference to FIG. 7.

In step S701, the assignment calculator 302 loads the number of terminal apparatuses on the transmitting side, connected to the self terminal apparatus, which number is acquired by the overall controller 301 that controls the terminal apparatus.

In step S702, the assignment calculator 302 loads the audio output relationship information 208 of the self terminal apparatus. In step S703, the assignment calculator 302 groups audio output devices based on the number of terminal apparatuses acquired in step S701 and the audio output relationship information 208 loaded in step S702, and determines the terminal apparatuses on the transmitting side which are to be associated with the groups.

In step S704, the assignment calculator 302 sequentially continues processing for each group. In step S705, the assignment calculator 302 acquires audio input relationship information from the terminal apparatus associated with the group to be processed. Furthermore, in step S706, the assignment calculator 302 calculates assignments of audio data to the audio output devices of the group to be processed.

The assignment calculator 302 checks in step S707 if the processing has been executed for all the groups. If it is determined that groups to be processed still remain, the process returns to step S704 to repeat the processes in steps S705 and S706 for the group to be processed.

On the other hand, if it is determined that the processing has been executed for all the groups, the process advances to step S708, and the assignment calculator 302 merges the calculation results of the respective groups to output it as the overall calculation result.

As can be seen from the above description, according to this embodiment, the terminal apparatus has, as the audio output relationship information, information indicating grouping of the audio output devices on the receiving side according to the number of terminal apparatuses on the transmitting side, thus allowing the calculation of assignments.

As a result, the audio output devices for each site can be grouped. For example, when the installation positions of the audio output devices are grouped to the right and left sides for respective groups, the user can discriminate the site on the transmitting side based on the audio playback direction.

[Fifth Embodiment]

The first embodiment has explained the system including one terminal apparatus on the transmitting side, and a plurality of terminal apparatuses on the receiving side. However, the present invention is not limited to such a specific embodiment. For example, the system may include a plurality of terminal apparatuses on the transmitting side, and one terminal apparatus on the receiving side.

More specifically, the calculation processing of assignments of audio data to audio output devices and the playback processing of audio data of the terminal apparatus on the receiving side upon simultaneous reception of audio data from a plurality of terminal apparatuses in the video conference system shown in FIG. 1 will be described below.

Figure 8:
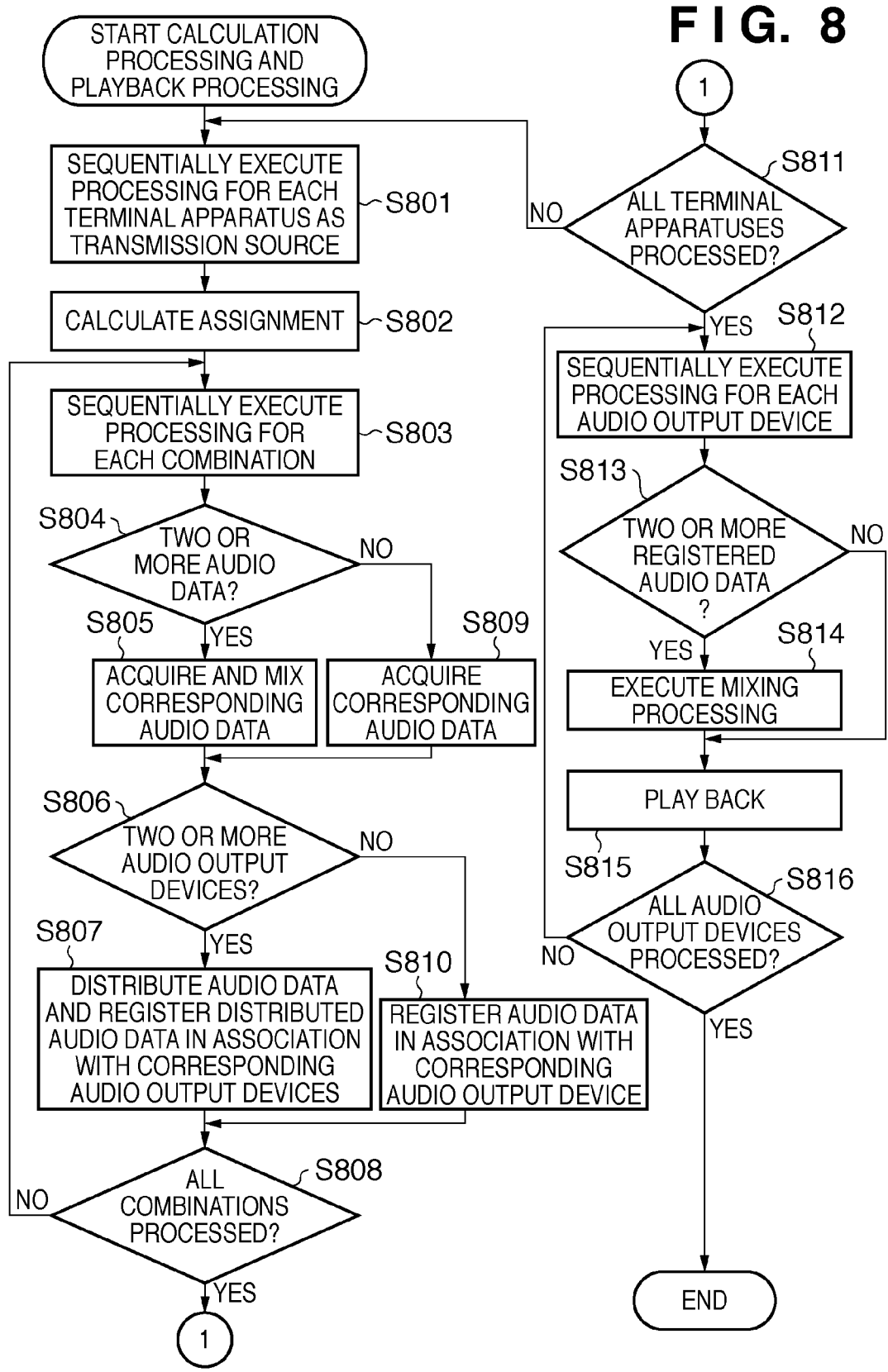
FIG. 8 is a flowchart showing the sequence of the assignment calculation processing of audio data to audio output devices and playback processing of audio data, which are executed by a terminal apparatus on the receiving side.

FIG. 8 is a flowchart showing the sequence of the calculation processing of assignments of audio data to audio output devices and the playback processing of audio data, which are executed by the terminal apparatus on the receiving side.

In case of the video conference system that connects many sites, the audio input relationship information 207 is transmitted from the terminal apparatus at each site and audio data are transmitted from audio input devices of that site. Hence, upon reception of the audio input relationship information 207 and audio data from a plurality of terminal apparatuses, each terminal apparatus on the receiving side sequentially starts processing in step S801.

In step S802, the assignment calculator 302 executes assignment calculation processing based on the audio input relationship information 207 from the terminal apparatus to be processed, and the audio output relationship information 208 of the terminal apparatus on the receiving side.

In step S803, processing is sequentially executed for each calculated combination of audio data and audio output devices. It is checked in step S804 if the combination to be processed includes two or more audio data.

If it is determined in step S804 that the combination includes two or more audio data, the process advances to step S805. In step S805, corresponding audio data are acquired from the received audio data, and the mixer 304 executes mixing processing.

On the other hand, if it is determined in step S804 that the combination includes one audio data, the process advances to step S809, and corresponding audio data is acquired from the received audio data.

It is checked in step S806 if the combination to be processed includes two or more audio output devices. If it is determined in step S806 that the combination includes two or more audio output devices, the process advances to step S807, and the distributor 303 executes distribution processing for distributing the audio data into data as many as the corresponding number of audio output devices. Furthermore, the storage unit 204 temporarily stores the audio data and audio output devices in association with each other.

On the other hand, if it is determined in step S806 that the combination includes one audio output device, the process advances to step S810, and the storage unit 204 temporarily stores the audio data and audio output device in association with each other.

It is checked in step S808 if all the calculated combinations of audio data and audio output devices have been processed. If it is determined in step S808 that combinations to be processed still remain, the process returns to step S803 to apply processing for the next combination to be processed.

On the other hand, if it is determined that all the combinations have been processed, the process advances to step S811 to check if all the terminal apparatuses on the transmitting side have been processed.

If it is determined in step S811 that terminal apparatuses to be processed on the transmitting side still remain, the process returns to step S801 to apply processing for the next terminal apparatus to be processed on the transmitting side. On the other hand, if it is determined that all the terminal apparatuses on the transmitting side have been processed, the process advances to step S812 to sequentially execute processing for each audio output device for the associations between the audio data and audio output devices, which are temporarily stored in the storage unit 204.

It is checked in step S813 if the audio output device to be processed is associated with two or more audio data. If it is determined in step S813 that the audio output device to be processed is associated with two or more audio data, the mixer 304 executes mixing processing of these two or more audio data in step S814.

On the other hand, if it is determined in step S813 that the audio output device to be processed is associated with one audio data, or after completion of the process in step S814, the process advances to step S815, and the audio output device is controlled to play back the audio data via the audio output unit 203.

It is checked in step S816 if all the audio output devices have been processed for the associations between the audio data and audio output devices, which are stored in the storage unit 204. If it is determined in step S816 that audio output devices to be processed still remain, the process returns to step S812 to apply processing to the next audio output device to be processed. On the other hand, if it is determined in step S816 that all the audio output devices have been processed, the processing ends.

As can be seen from the above description, according to this embodiment, since the assignment when there is one terminal apparatus on the transmitting side is one is the same as that when there are a plurality of terminal apparatuses on the transmitting side, the user need not consider the connected terminal apparatuses on the transmitting side.

For example, when the audio input relationship information 207 and audio output relationship information 208 play roles of a chairperson, presenter, or audience of people who use the audio input devices and audio output devices, the playback volume can be changed for each role irrespective of the sites.

[Sixth Embodiment]

The fourth embodiment uses the information indicating grouping of audio output devices on the receiving side in accordance with the number of terminal apparatuses on the transmitting side as the audio output relationship information. However, the present invention is not limited to such specific information. For example, combinations of audio data and their priority levels may be used as the audio input relationship information, and combinations of audio output devices and their priority levels may be used as the audio output relationship information.

A case will be explained below wherein audio data are transmitted from the terminal apparatus 104 to which five audio input devices are connected to the terminal apparatus 106 to which eight audio output devices are connected in the video conference system shown in FIG. 1.

<1. Example of Audio Input Relationship Information>

FIG. 9A is a view showing an example of audio input relationship information 207 according to this embodiment, which is transmitted from the terminal apparatus 104 together with five audio data. As shown in FIG. 9A, the audio input relationship information of this embodiment includes information associated with the identifiers of audio input devices used to generate respective audio data and their priority levels (priority level=1 is highest, and priority level=5 is lowest).

<2. Example of Audio Output Relationship Information>

FIG. 9B is a view showing an example of audio output relationship information 208 of the terminal apparatus 106 according to this embodiment. As shown in FIG. 9B, the audio output relationship information of this embodiment includes information associated with the identifiers of respective audio output devices and their priority levels.

<3. Sequence of Assignment Processing in Assignment Calculator>

Figure 10:
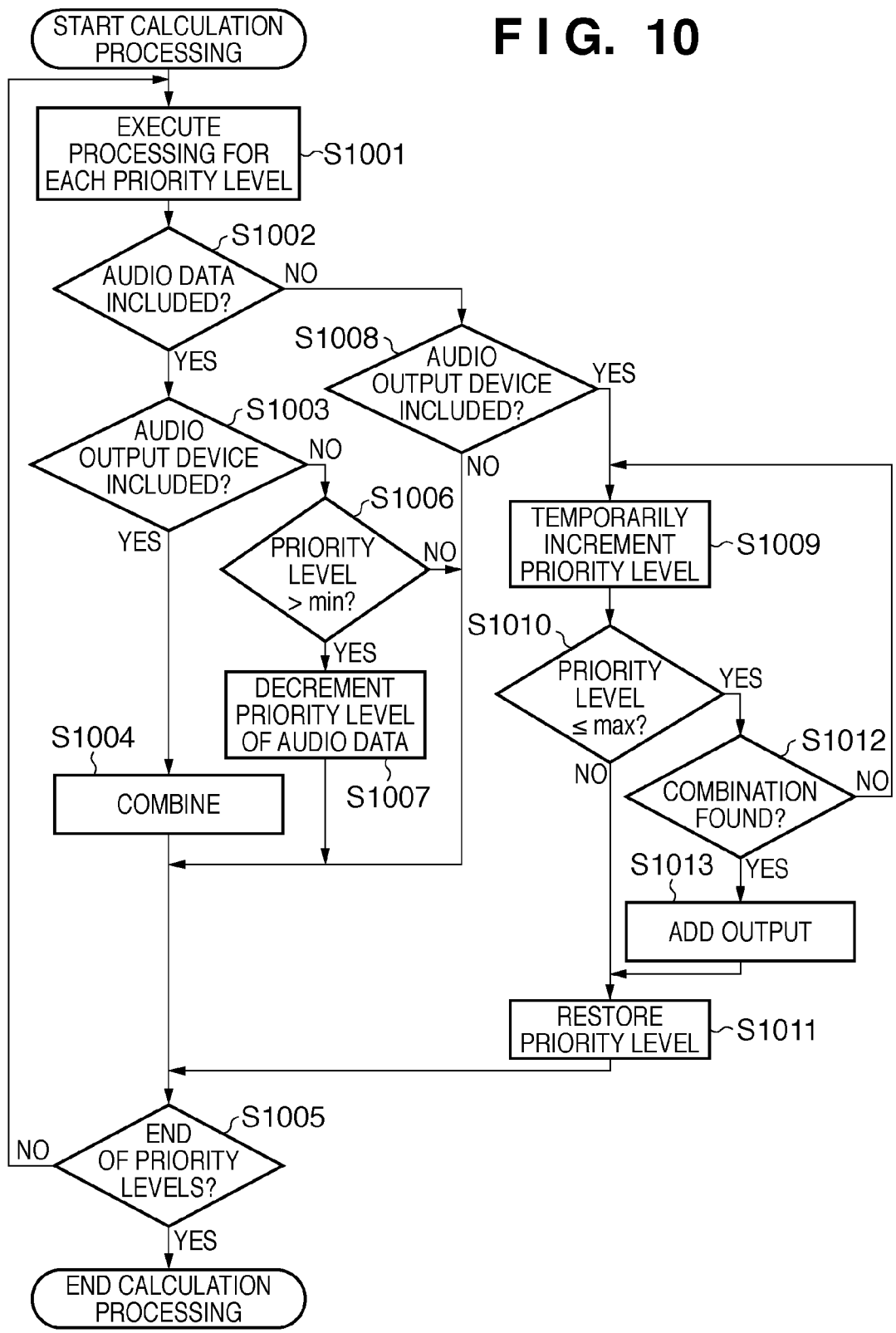
FIG. 10 is a flowchart showing the sequence of assignment calculation processing in the assignment calculator 302.

FIG. 10 is a flowchart showing the sequence of the assignment calculation processing in the assignment calculator 302. The sequence of the assignment calculation processing of this embodiment will be described below with reference to FIG. 10.

In step S1001, the assignment calculator 302 executes processing in descending order of priority level to be processed. The calculator 302 checks in step S1002 if the audio input relationship information includes audio data having the priority level to be processed.

If it is determined in step S1002 that the audio input relationship information includes audio data having the priority level to be processed, the process advances to step S1003 to check if the audio output relationship information includes an audio output device having the same priority level as the priority level to be processed.

If it is determined in step S1003 that the audio output relationship information includes the audio output device having the same priority level as the priority level to be processed, the process advances to step S1004 to combine the audio data and the audio output device.

The assignment calculator 302 checks in step S1005 if all the priority levels have been processed. If it is determined in step S1005 that priority levels to be processed still remain, the process returns to step S1001 to execute processing for the next priority level to be processed.

On the other hand, if it is determined in step S1003 that the audio output relationship information does not include any audio output device having the same priority level as the priority level to be processed, the process advances to step S1006 to check if the priority level to be processed is larger than a minimum value of the priority level. If it is determined in step S1006 that the priority level to be processed is larger than the minimum value of the priority level, the process advances to step S1007 to decrement the priority level to be processed by one.

On the other hand, if it is determined in step S1002 that the audio input relationship information does not include any audio data having the priority level to be processed, the process advances to step S1008 to check if an audio output device having the same priority level as the priority level to be processed exists. If it is determined in step S1008 that such audio output device exists, the process advances to step S1009 to temporarily increment the priority level to be processed by one.

Furthermore, the assignment calculator 302 checks in step S1010 if the temporarily incremented priority level is equal to or smaller than the maximum value of the priority level. If it is determined in step S1010 that the temporarily incremented priority level is equal to or smaller than the maximum value of the priority level, the process advances to step S1012 to check if the combinations processed so far include a combination of the audio data and the audio output device having the temporarily incremented priority level.

If it is determined in step S1012 that such combination is included, the process advances to step S1013 to add the audio output device which is found in step S1008 to that combination. On the other hand, if it is determined in step S1012 that no such combination is included, the process returns to step S1009 to continue the processing.

On the other hand, if it is determined that the temporarily incremented priority level is larger than the maximum value of the priority level, or if the audio output device is added to the combination in step S1013, the process advances to step S1011 to restore the temporarily incremented priority level to the original priority level.

Upon execution of the calculation processing, as described above, the site on the transmitting side need only set the audio input relationship information in association with the priority levels of input audio data regardless of the arrangement of audio output devices of the site on the receiving side, thus assigning appropriate audio output devices.

Likewise, the site on the receiving side sets the audio output relationship by determining the priority levels based on the models and installation positions of the audio output devices of the self site regardless of the arrangement of the audio input devices and participants in the site on the transmitting side, thus assigning appropriate audio output devices. That is, since the environment and arrangement of the partner site such as devices need not be recognized, easy settings are allowed.

FIG. 11 shows an example of combinations of audio data and audio output devices, the assignments of which are calculated based on FIGS. 9A and 9B. SP3 (audio output device 128) having priority level=2 is added to a combination with an audio output device having priority level=1 which is higher by one level since there is no audio data having priority level=2. Audio data (that generated by Audio3) having priority level=3 is added to a combination with audio data having priority level=4, which is lower by one level, since there is no audio output device having the same priority level.

As can be seen from the above description, according to this embodiment, when the user sets audio data and their priority levels or audio output devices and their priority levels at each site, the audio data can be automatically assigned to optimal audio output devices.

[Seventh Embodiment]

In the sixth embodiment, the audio data and their priority levels are set as the audio input relationship information, and the audio output devices and their priority levels are set as the audio output relationship information. However, the present invention is not limited to this.

For example, pieces of information of the installation positions of audio input devices may be set as the audio input relationship information, and pieces of information of the installation positions of audio output devices may be set as the audio output relationship information.

More specifically, as the audio input relationship information, relative regions between a predetermined reference point and sound pickup regions of respective audio input devices in the site of the terminal apparatus on the transmitting side are set.

Also, as the audio output relationship information, relative regions between a predetermined reference point and output regions of respective audio output devices in the site of the terminal apparatus on the receiving side are set.

Then, the assignment calculator 302 of the terminal apparatus on the receiving side calculates combinations of audio data and audio output devices so that the reference point in the received audio input relationship information coincides with that of the stored audio output relationship information. More specifically, the assignment calculator 302 combines audio data and audio output devices, so that the sound pickup regions of the audio input devices overlap the output regions of the audio output devices.

With this arrangement, each terminal apparatus need only set the audio input relationship information and audio output relationship information based on the installation positions of the audio input devices or audio output devices of the self site. That is, since the terminal apparatus need not detect the installation positions of the audio input devices or audio output devices of the partner site, easy settings are allowed.

[Eighth Embodiment]

In the sixth embodiment, the audio input relationship information and audio output relationship information are set using tables. However, the present invention is not limited to this.

For example, the relationship among audio input devices may be defined using a tree structure as the audio input relationship information, and the relationship among audio output devices may be defined using a tree structure as the audio output relationship information.

<1. Example of Audio Input Relationship Information and Audio Output Relationship Information>

FIGS. 12A and 12B show examples of audio input relationship information and audio output relationship information when audio data are transmitted from the terminal apparatus 104 to which the five audio input devices are connected to the terminal apparatus 106 to which the eight audio output devices are connected in the video conference system shown in FIG. 1.

FIG. 12A shows the audio input relationship information 207 which is transmitted from the terminal apparatus 104 together with five audio data, and the relationship among the audio input devices which generate respective audio data is defined using a tree structure. This tree structure relationship may indicate the priority levels of audio data, may indicate the installation positions of the audio input devices of audio data, or may indicate their combination.

FIG. 12B shows the audio output relationship information 208 of the terminal apparatus 106, and the relationship among the respective audio output devices is defined using a tree structure. This tree structure relationship may indicate the priority levels of audio output devices, may indicate the installation positions of the audio output devices, or may indicate their combination.

<2. Overview of Assignment Calculation Processing in Assignment Calculator>

The assignment calculator 302 of the terminal apparatus 106 overlays the tree structures of the audio input relationship information 207 and audio output relationship information 208 from their roots. Then, if either the tree structure reaches a leaf, audio data (or audio output device) of that leaf is combined with an audio output device (or audio data) of a leaf ahead of a node of the other tree structure, whose node corresponds to that leaf.

Figures 13, 14:
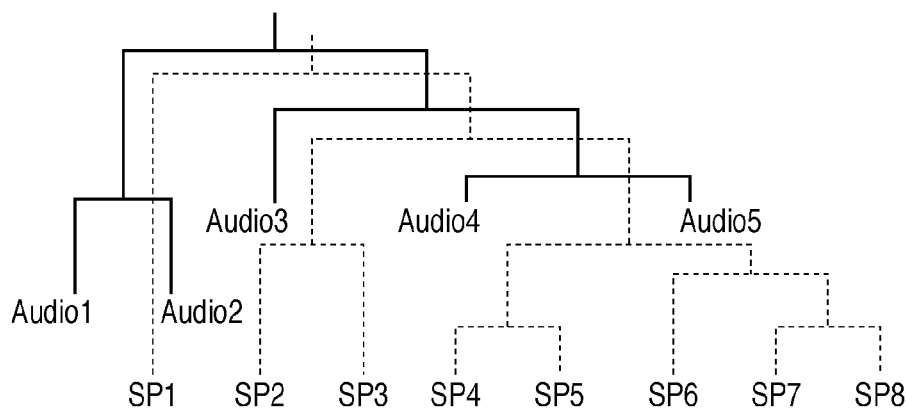
FIG. 13 shows an image when the tree structures of the audio input relationship information in FIG. 12A and the audio output relationship information in FIG. 12B are overlaid on each other.
FIG. 14 is a view showing the assignments of audio data to audio output devices calculated based on FIGS. 12A and 12B.

FIG. 13 shows an image upon overlaying the tree structures of the audio input relationship information in FIG. 12A and the audio output relationship information in FIG. 12B. In FIG. 13, SP1 of the audio output relationship information reaches a leaf earlier than the audio input relationship information. For this reason, audio data of Audio1 and Audio2 (audio input devices 107 and 108) of leaves ahead of a node of the audio input relationship information, which node corresponds to that leaf, are combined with SP1 (audio output device 126).

Since Audio3 of the audio input relationship information reaches a leaf earlier than the audio output relationship information, SP2 and SP3 (audio output devices 127 and 128) of leaves ahead of the corresponding node are combined with audio data of Audio3 (audio input device 109).

Likewise, since Audio4 of the audio input relationship information reaches a leaf earlier than the audio output relationship information, SP4 and SP5 (audio output devices 129 and 130) of leaves ahead of the corresponding node are combined with audio data of Audio4 (audio input device 110).

Furthermore, since Audio5 of the audio input relationship information reaches a leaf earlier than the audio output relationship information, SP6, SP7, and SP8 (audio output devices 131 to 133) of leaves ahead of the corresponding node are combined with audio data of Audio5 (audio input device 111).

FIG. 14 is a view showing the assignments of audio data to audio output devices, which are calculated based on FIGS. 12A and 12B.

Note that the audio input relationship information and audio output relationship information may describe tree structures using a data format such as XML that can include attributes.

<3. Details of Assignment Calculation Processing in Assignment Calculator>

Figure 15:
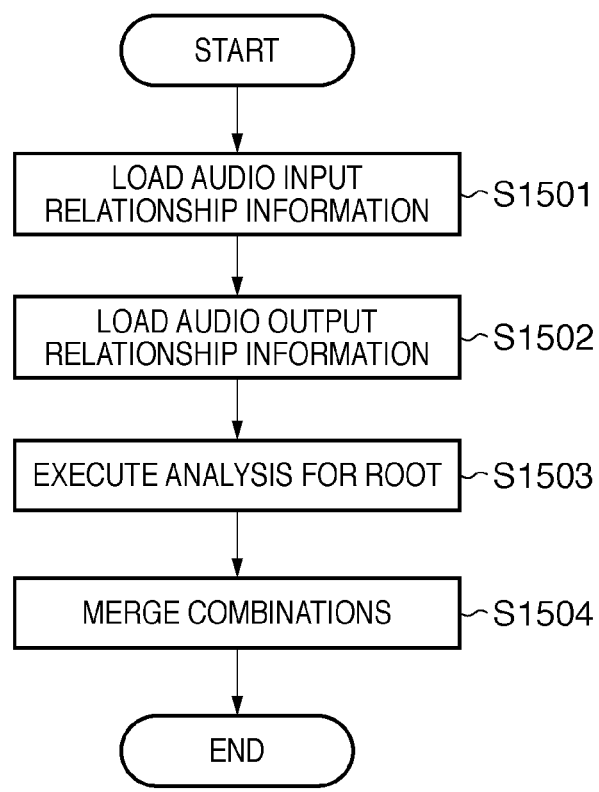
FIG. 15 is a flowchart showing assignment calculation processing in the assignment calculator 302.
Figure 16:
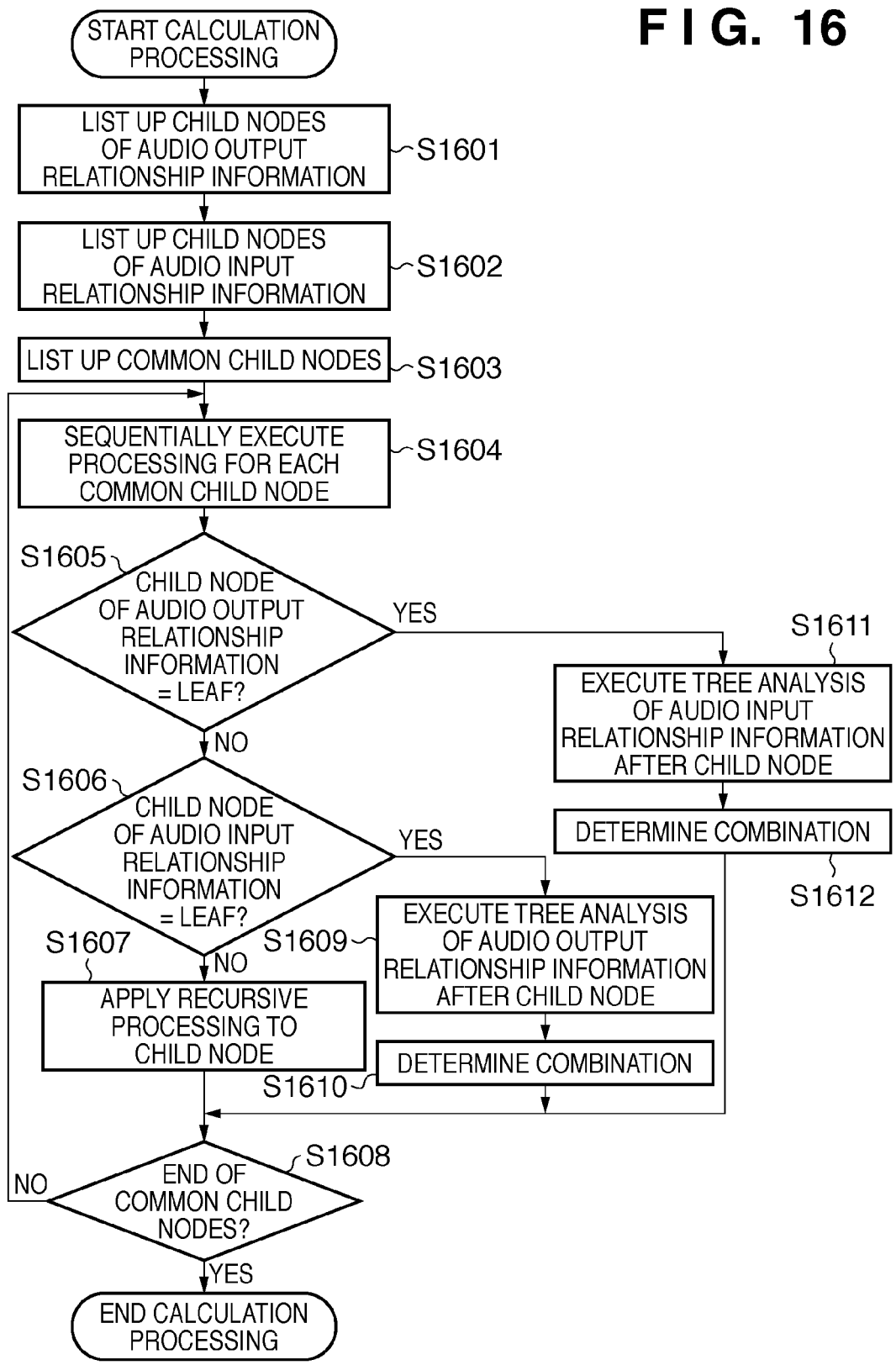
FIG. 16 is a flowchart showing assignment calculation processing in the assignment calculator 302.

FIGS. 15 and 16 are flowcharts showing the assignment calculation processing in the assignment calculator 302. The sequence of the assignment calculation processing of this embodiment will be described below with reference to FIGS. 15 and 16.

In step S1501, the assignment calculator 302 loads audio input relationship information which is expressed by a tree structure, so as to execute the assignment calculation processing. In step S1502, the calculator 302 loads audio output relationship information which is expressed by a tree structure, so as to execute the assignment calculation processing.

In step S1503, the assignment calculator 302 applies analysis processing to the root nodes of the tree structures. Note that details of the analysis processing will be described later. In step S1504, the calculator 302 merges combinations of audio data and audio output devices, calculated as a result of the analysis processing in step S1503, and outputs it as a calculation result.

FIG. 16 is a flowchart showing the sequence of the detailed processing of the analysis processing in step S1503.

In step S1601, the assignment calculator 302 lists up child nodes of a node to be processed in the tree structure of the audio output relationship information. In step S1602, the calculator 302 lists up child nodes of a node to be processed in the tree structure of the audio input relationship information.

In step S1603, the assignment calculator 302 lists up common child nodes in the list of the child nodes of the audio output relationship information, and that of the child nodes of the audio input relationship information. In step S1604, the calculator 302 sequentially executes processing for each common child node.

The assignment calculator 302 checks in step S1605 if the child node to be processed is a leaf in the audio output relationship information. If it is determined in step S1605 that the child node to be processed is a leaf in the audio output relationship information, the process advances to step S1611. In step S1611, the calculator 302 analyzes a tree which includes that child node in the audio input relationship information, and is located on the child side of that child node, so as to list up audio data. Furthermore, in step S1612, the calculator 302 combines an audio output device of the child node to be processed with the audio data listed up in step S1611.

On the other hand, if it is determined in step S1605 that the child node to be processed is not a leaf in the audio output relationship information, the assignment calculator 302 checks in step S1606 if the child node to be processed is a leaf in the audio input relationship information.

If it is determined in step S1606 that the child node is a leaf in the audio input relationship information, the process advances to step S1609. In step S1609, the assignment calculator 302 analyzes a tree which includes that child node in the audio output relationship information, and is located on the child side of that child node, so as to list up audio output devices.

Furthermore, in step S1610, the assignment calculator 302 combines audio data of the child node to be processed with the audio output devices listed up in step S1609.

On the other hand, if it is determined in step S1606 that the child node is not a leaf in the audio input relationship information, the process advances to step S1607 to recursively call the processing in FIG. 16 for the child node to be processed, thus processing that child node.

The assignment calculator 302 checks in step S1608 if all the common child nodes listed up in step S1603 have been processed. If it is determined in step S1608 that child nodes to be processed still remain, the process returns to step S1604 to execute the processing of the next child node to be processed.

On the other hand, if it is determined that all the common child nodes have been processed, the processing ends.

As can be seen from the above description, according to this embodiment, the audio input relationship information or audio output relationship information need only be set in consideration of only the audio input devices or audio output devices of the self site without regarding the apparatus arrangement of the partner site.

[Ninth Embodiment]

The eighth embodiment has explained the system including one terminal apparatus on the transmitting side and one terminal apparatus on the receiving side. However, the present invention is not limited to this. For example, the system may include a plurality of terminal apparatuses on the transmitting side, and one terminal apparatus on the receiving side.

More specifically, the processing contents in the terminal apparatus 106 when the terminal apparatus 104 transmits five audio data and the terminal apparatus 105 transmit one audio data in the video conference system shown in FIG. 1 will be described below.

Figure 17A:
FIG. 17A is a view showing an example of audio input relationship information.

Assume that the audio input relationship information 207 transmitted from the terminal apparatus 104 is as shown in FIG. 12A, and that transmitted from the terminal apparatus 105 is as shown in FIG. 17A. Also, assume that the audio output relationship information 208 stored in the terminal apparatus 106 is as shown in FIG. 12B.

The assignment calculator 302 of the terminal apparatus 106 sets identifiers of audio data included in the respective pieces of received audio input relationship information to be uniquely distinguished from each other, and composites all the pieces of received audio input relationship information into one tree structure by, for example, adding a new node.

Figure 17B:
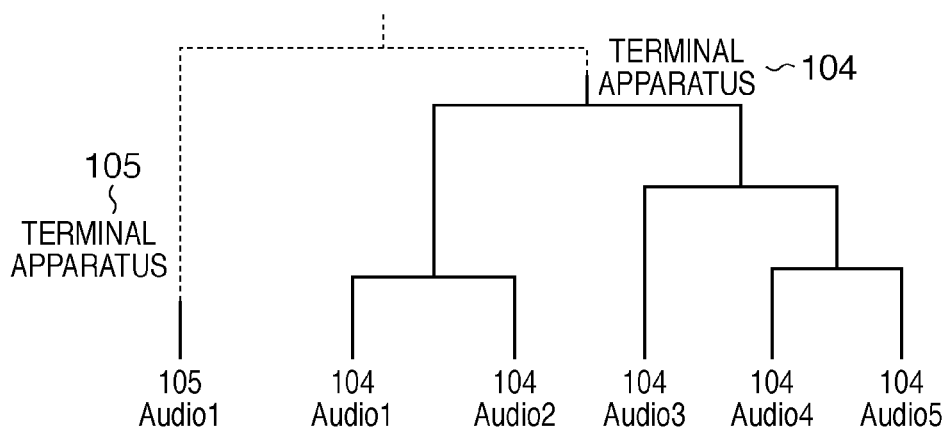
FIG. 17B is a view showing one tree structure obtained by joining the roots in FIGS. 12A and 17A.

FIG. 17B is a view showing one tree structure formed by coupling the roots of FIGS. 12A and 17A. As a method of compositing a plurality of pieces of audio input relationship information into one tree structure, the roots may be connected to each other, or a node may be added to the middle of a certain tree structure and the root of another tree structure may be added to that node.

The assignment calculator 302 of the terminal apparatus 106 overlays the tree structures of the composite audio input relationship information 207 and the audio output relationship information 208 from the roots. Then, when either tree structure reaches a leaf, audio data (or audio output device) of that leaf is combined with an audio output device (or audio data) of a leaf ahead of the node of the other tree structure corresponding to that leaf.

Figures 17C, 17D:
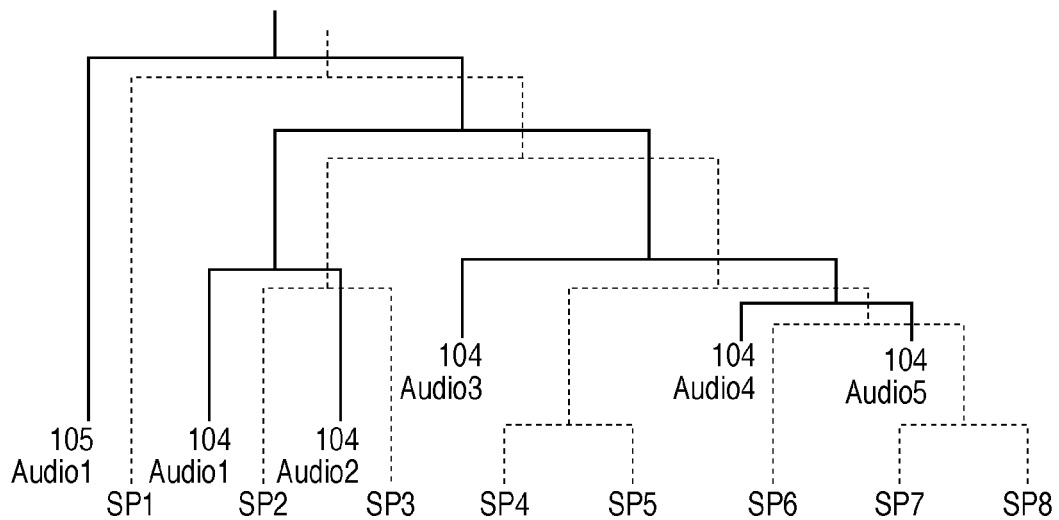
FIG. 17C shows an image when the tree structures of composite audio input relationship information shown in FIG. 17B and the audio output relationship information shown in FIG. 12B are overlaid on each other.
FIG. 17D is a view showing the assignments of audio data to audio output devices, which are calculated based on FIGS. 12A and 17A showing the audio input relationship information and FIG. 12B showing the audio output relationship information.

FIG. 17C shows an image upon overlaying the tree structures of the composite audio input relationship information in FIG. 17B and the audio output relationship information in FIG. 12B. Audio data of Audio1 (audio input device 115) transmitted from the terminal apparatus 105 is combined with SP1 (audio output device 126) since both of them reach leaves.

Likewise, audio data of Audio1 (audio input device 107) of the terminal apparatus 104 is combined with SP2 (audio output device 127). Also, audio data of Audio2 (audio input device 108) of the terminal apparatus 104 is combined with SP3 (audio output device 128). Furthermore, audio data of Audio4 (audio input device 110) of the terminal apparatus 104 is combined with SP6 (audio output device 131).

Since Audio3 that generates audio data reaches a leaf earlier, SP4 and SP5 (audio output devices 129 and 130) of leaves ahead of a corresponding node are combined with the audio data of Audio3 (audio input device 109). Likewise, since Audio5 reaches a leaf earlier, SP7 and SP8 (audio output devices 132 and 133) of leaves ahead of a corresponding node are combined with audio data of Audio5 (audio input device 111).

FIG. 17D is a view showing the assignments of audio data to the audio output devices, which are calculated based on FIGS. 12A and 17A that show the audio input relationship information, and FIG. 12B that shows the audio output relationship information.

With this arrangement, even in the system including a plurality of terminal apparatuses on the transmitting side and one terminal apparatus on the receiving side, the assignments can be calculated.

[10th Embodiment]

Each of the above embodiments has explained the case in which the audio input devices and audio output device are directly connected to each terminal apparatus. However, the present invention is not limited to this.

For example, each terminal apparatus may use, as the audio input devices or audio output devices, microphones or loudspeakers which are incorporated in or connected to other devices (personal computers, network cameras, televisions, and the like) connected to the network.

In this case, the storage unit 204 stores the identifiers of audio input devices, the addresses of devices to which microphones used as the audio input devices are connected, and protocols (H323, SIP, HTTP, unique protocol, and the like) required to acquire audio data from these devices. Also, the storage unit 204 stores the codecs (G711, gsm, ulaw, MP3, and the like) of the audio data as needed.

When the terminal apparatus obtains audio data, the processing unit 206 acquires information of the address, protocol, and codec of the corresponding device from the storage unit 204. Furthermore, the processing unit 206 requests that device to transmit data including an audio using the predetermined protocol via the communication unit 205, and acquires audio data by applying decode processing to the acquired data in association with the protocol and codec.

On the other hand, when the terminal apparatus outputs audio data, it acquires information of the address, protocol, and codec from the storage unit 204. Then, the terminal apparatus encodes audio data using the information of the codec, converts the encoded data into data of the predetermined protocol, and transmits the converted data to the address of the corresponding device via the communication unit 205.

With this arrangement, the audio input devices and audio output devices can be used via the network.

[11th Embodiment]

Each of the above embodiments does not particularly mention the display method of the assignment calculation method. However, the terminal apparatus according to the present invention may have a function of displaying the assignment calculation processing result of the assignment calculator 302.

Also, each of the above embodiments does not particularly mention about the setting method of the audio input relationship information and audio output relationship information. However, the terminal apparatus according to the present invention may be configured to set these pieces of information via a predetermined user interface.

Figure 18:
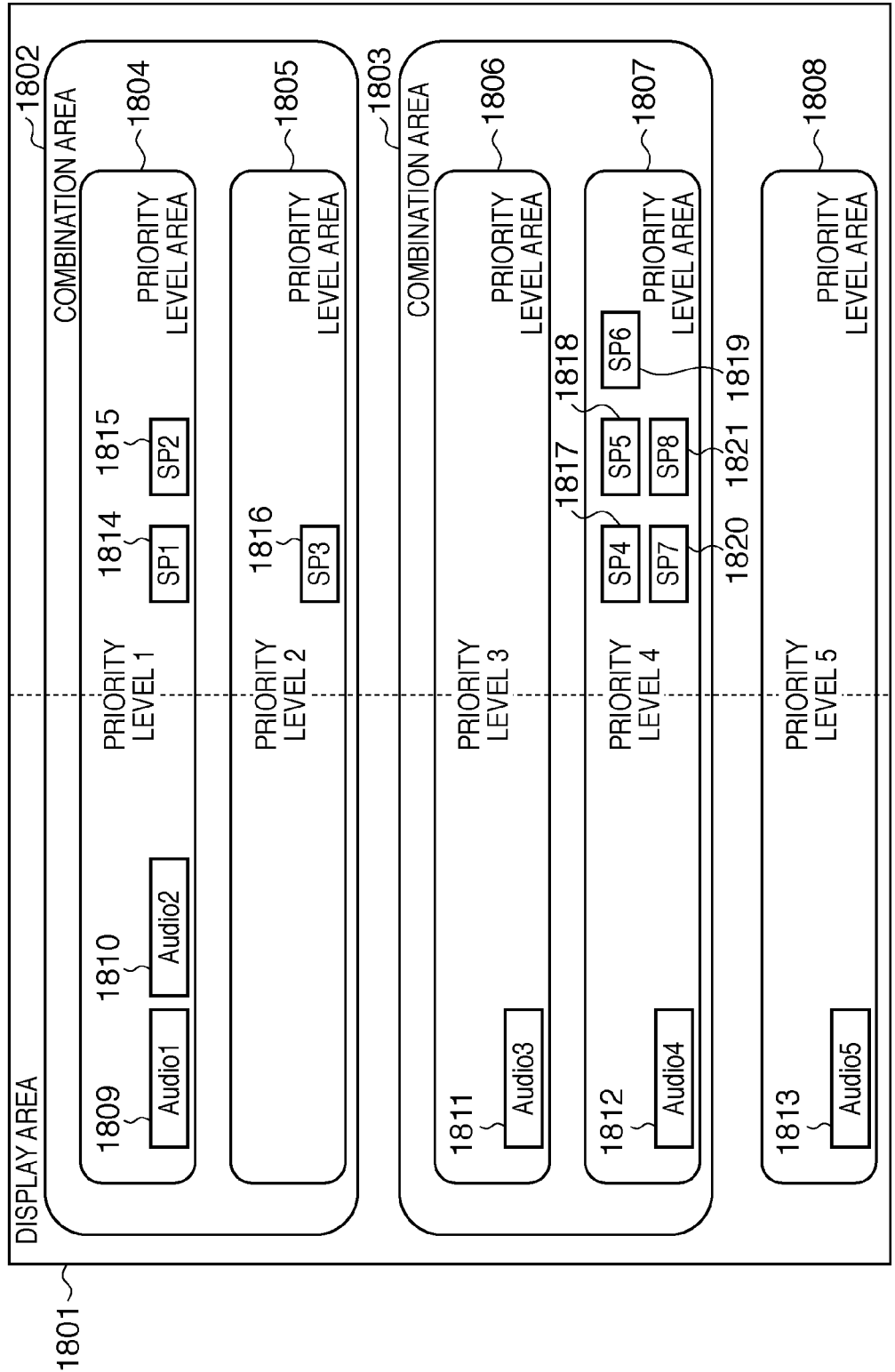
FIG. 18 is a view showing a display example of the calculation result.

FIG. 18 is a view showing a display example of the calculation result upon calculating the assignments based on the audio input relationship information and audio output relationship information that have been explained in the sixth embodiment. Reference numeral 1801 denotes a display area of a display, dialog, window, or the like.

Reference numerals 1802 and 1803 denote areas for displaying combined sets. Five areas 1804 to 1808 show priority levels. Reference numerals 1809 to 1813 denote icons indicating audio data; and 1814 to 1821, icons indicating audio output devices.

The example of FIG. 18 indicates that audio data of Audio1 and Audio2 are played back by the audio output devices of SP1, SP2 and SP3. Also, the example of FIG. 18 indicates that audio data of Audio3 and Audio4 are played back by SP4, SP5, SP6, SP7, and SP8, and audio data of Audio5 is not played back.

In the terminal apparatus according to this embodiment, when the icon of SP8 is moved to the area of priority level=5, audio data to be played back by SP8 is switched from that of Audio4 to that of Audio5, and the priority level of SP5 is changed to "5" in the audio output relationship information.

Note that a state that does not include displays of the combination areas 1802 and 1803 and those of the icons 1814 to 1821 of the audio output devices in FIG. 18 corresponds to the display example of the audio input relationship information 207. In this case, by moving the icons 1809 to 1813 of audio data, the audio input relationship information can be changed.

Also, a state that does not include displays of the combination areas 1802 and 1803 and those of the icons 1809 to 1813 of the audio data in FIG. 18 corresponds to the display example of the audio output relationship information 208. In this case, by moving the icons 1814 to 1821 of the audio output devices, the audio output relationship information can be changed.

FIG. 19 is a view showing a display example of the calculation result upon calculating the assignments when the audio input relationship information and audio output relationship information are defined by tree structures, as described in the eighth embodiment. Reference numeral 1901 denotes a display area of a display, dialog, window, or the like.

Reference numeral 1902 denotes a display of a tree structure obtained by overlaying tree structures specified as the audio input relationship information and audio output relationship information. Reference numerals 1903 to 1907 denote icons indicating audio data. Reference numerals 1908 to 1915 denote icons indicating audio output devices.

In the example of FIG. 19, audio data of Audio1 and Audio2 are mixed and played back by the audio output device of SP1. Also, audio data of Audio3 is distributed and played back by the audio output devices of SP2 and SP3. Audio data of Audio4 is distributed and played back by the audio output devices of SP4 and SP5. Audio data of Audio5 is distributed and played back by the audio output devices of SP6, SP7, and SP8.

In the terminal apparatus according to this embodiment, by moving the icons of audio data, those of audio output devices, or nodes of the tree structure, the assignments of audio data to the audio output devices can be changed.

Even when the plurality of terminal apparatuses are connected, as described in the ninth embodiment, the assignment calculation result is displayed using the tree structure, the icons of audio output devices, and those of audio data. The assignments can be changed by moving the icons of audio output devices and the nodes of the tree structure, or by moving the root of the tree structure of each site.

Note that a state that does not include displays of the icons 1908 to 1915 of the audio output devices in FIG. 19 corresponds to the display example of the audio input relationship information 207. In this case, the audio input relationship information can be changed by moving the icons 1903 to 1907 of audio data.

Also, a state that does not include displays of the icons 1903 to 1907 of the audio data in FIG. 19 corresponds to the display example of the audio output relationship information 208. In this case, the audio output relationship information can be changed by moving the icons 1908 to 1915 of the audio output devices.

Using the aforementioned displays, the user not only can easily recognize the assignment calculation result of audio data to the audio output devices but also can easily change the assignments. Also, the user can easily set the audio input relationship information and audio output relationship information.

[Other Embodiments]

Note that the present invention may be applied to either a system constituted by a plurality of devices (e.g., a host computer, interface device, reader, and printer), or an apparatus consisting of a single device (e.g., a copying machine or facsimile apparatus).

The objects of the present invention are also achieved by supplying a computer-readable storage medium, which stores a program code of software that implements the functions of the aforementioned embodiments to the system or apparatus. In this case, the functions are implemented when a computer (or a CPU or MPU) of the system or apparatus reads out and executes the program code stored in the recording medium. Note that the recording medium that stores the program code constitutes the present invention in such case.

As the recording medium for supplying the program code, for example, a floppy® disk, hard disk, optical disk, magneto-optical disk, CD-ROM, CD-R, magnetic tape, nonvolatile memory card, and ROM may be used.

The present invention is not limited to the case in which the functions of the aforementioned embodiments are implemented when the computer executes the readout program code. For example, the present invention also includes a case in which an OS (operating system) or the like running on a computer may execute some or all of actual processes based on an instruction of the program code to implement the functions of the aforementioned embodiments.

Furthermore, the present invention also includes a case in which the functions of the aforementioned embodiments are implemented after the program code read out from the recording medium is written in a memory equipped on a function expansion board or unit, which is inserted into or connected to the computer. That is, the present invention includes a case in which after the program code is written in the memory, a CPU or the like equipped on the function expansion board or unit executes some or all of actual processes based on an instruction of the program code, so as to implement the functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-054069 filed on Mar. 4, 2008, which is hereby incorporated by reference herein in its entirety.

What is claimed is:

1. An information processing apparatus which is connectable to a plurality of audio output devices, comprising:
   a mixing processing unit configured to mix first audio data and second audio data included in a first group of a plurality of audio data items based on information for calculating groupings of the plurality of audio data items; and
   a distribution unit configured to distribute audio data mixed by the mixing processing unit to at least some of the plurality of audio output devices based on a correspondence between the information for calculating groupings of the plurality of audio data items and information for groupings of the plurality of audio output devices,
   wherein the plurality of audio data items are received via a network and grouped into a plurality of groups, and the plurality of audio output devices are grouped into a plurality of groups.

2. The apparatus according to claim 1, further comprising:
   a reception unit configured to receive, together with the audio data, relationship information of audio data items wherein the relationship information is used for calculating groupings of the plurality of audio data items.

3. The apparatus according to claim 2, wherein the distribution unit determines, every time the information for calculating groupings of the plurality of audio data items is updated, one or more audio output devices to which one of the plurality of audio data items is distributed.

4. The apparatus according to claim 1, wherein the information for calculating groupings of the plurality of audio data items is generated based on a priority level of each of the plurality of audio data items and a priority level of each of the audio output devices, and
   wherein the distribution unit is configured to distribute the first audio data of the plurality of audio data to an audio output device having a same priority level as the priority level of the first audio data.

5. The apparatus according to claim 4, wherein the priority level of the audio output device is determined based on installation positions of the audio output device.

6. The apparatus according to claim 1, wherein the information for calculating groupings of the plurality of audio data items is generated based on relationship information of audio data items defined by tree structures and relationship information of the plurality of audio output devices defined by tree structures.

7. The apparatus according to claim 1, further comprising:
   a distributing unit configured to distribute third audio data of the plurality of audio data items if the third audio data is played back by a plurality of audio output devices.

8. The apparatus according to claim 1, wherein the information processing apparatus receives the plurality of audio data items via the network from one or more terminal apparatuses,
   wherein the information for calculating groupings of the plurality of audio data items is generated based on information indicating one or more terminal apparatuses from which each of the plurality of audio data items is transmitted to the information processing apparatus and information for groupings of as many groups of the audio output devices as a number of the terminal apparatuses, and
   wherein the distribution unit is configured to distribute one of the plurality of audio data items to one or more audio output devices so that audio data which are transmitted from the same terminal apparatus are distributed to the same audio output device.

9. The apparatus according to claim 1, further comprising:
   a storage unit configured to store a first protocol required to acquire audio data from a first audio input device which is connected to the information processing apparatus and to store a second protocol required to output the audio data to a second audio output device which is connected to the information processing apparatus; and
   an acquiring unit configured to acquire audio data from the first audio input device using the first protocol stored in the storage unit;
   wherein the distribution unit is configured to distribute audio data mixed by the mixing processing unit and converted into data of the second protocol to the second audio output device.

10. The apparatus according to claim 1, further comprising:
    an assignment unit configured to assign the first audio data and the second audio data with a second group including one or more audio output devices based on a relationship of audio data items and a relationship of the plurality of audio output devices;
    wherein the information for calculating groupings of the plurality of audio data items corresponds to a result of an assignment by the assignment unit.

11. An information processing system in which an information processing apparatus is connected to a plurality of audio output devices, the information processing apparatus comprising:
    a mixing processing unit configured to mix first audio data and second audio data in a first group of a plurality of audio data items based on information for calculating groupings of the plurality of audio data items; and
    a distribution unit configured to distribute audio data mixed by the mixing processing unit to at least some of the plurality of audio output devices based on a correspondence between the information for calculating groupings of the plurality of audio data items and information for groupings of the audio output devices,
    wherein the plurality of audio data items are received via a network and grouped into a plurality of groups, and the plurality of audio output devices are grouped into a plurality of groups.

12. The information processing system according to claim 11, further comprising:
    a reception unit configured to receive, together with the audio data, relationship information of audio data items, wherein the relationship information is used for calculating groupings of the plurality of audio data items.

13. The information processing system according to claim 11,
wherein the information for calculating groupings of the plurality of audio data items is generated based on a priority level of each of the plurality of audio data items and a priority level of each of the audio output devices, and
wherein the distribution unit is configured to distribute the first audio data to one or more audio output devices having a same priority level as the priority level of the first audio data.

14. A method of controlling an information processing apparatus which is connected to a plurality of audio output devices, comprising:
mixing first audio data and second audio data in a first group of a plurality of audio data items based on information for calculating groupings of the plurality of audio data items; and
distributing mixed audio data to at least some of the plurality of audio output devices based on a correspondence between the information for calculating groupings of the plurality of audio data items and information for groupings of the audio output devices,
wherein the plurality of audio data items are received via a network and grouped into a plurality of groups, and the plurality of audio output devices are grouped into a plurality of groups.

15. The method according to claim 14, further comprising:
distributing third audio data of the plurality of audio data items if the third audio data is played back by a plurality of audio output devices.

16. The method according to claim 14, further comprising:
assigning the first audio data and the second audio data with a second group including one or more audio output devices based on a relationship of audio data items and a relationship of the plurality of audio output devices;
wherein the information for calculating groupings of the plurality of audio data items corresponds to a result of an assignment of the assigning step.

17. A non-transitory computer-readable storage medium storing a program for making a computer execute a method of controlling an information processing apparatus which is connectable to a plurality of audio output devices, comprising:
mixing first audio data and second audio data in a first group of a plurality of audio data items based on information for calculating groupings of the plurality of audio data items; and
distributing mixed audio data to at least some of the plurality of audio output devices based on a correspondence between the information for calculating groupings of the plurality of audio data items and information for groupings of the audio output devices,
wherein the plurality of audio data items are received via a network and grouped into a plurality of groups, and the plurality of audio output devices are grouped into a plurality of groups.

18. The non-transitory computer-readable storage medium according to claim 17, the storage medium further comprising:
computer-executable instructions that assign the first audio data and the second audio data with a second group including one or more audio output devices based on a relationship of audio data items and a relationship of the plurality of audio output devices;
wherein the information for calculating groupings of the plurality of audio data items corresponds to a result of an assignment of the assigning step.

19. The non-transitory computer-readable storage medium according to claim 17, further comprising:
computer-executable instructions that receive, together with the audio data, relationship information of audio data items, wherein the relationship information is used for calculating groupings of the plurality of audio data items.

20. The non-transitory computer-readable storage medium according to claim 17,
wherein the information for calculating groupings of the plurality of audio data items is generated based on a priority levels of each of the plurality of audio data items and a priority level of each of the audio output devices, and
the storage medium further comprises:
computer-executable instructions that distributes the first audio data to an audio output device having a same priority level as the priority level of the first audio data.

* * * * *